United States Patent [19]

Benjamin

[11] Patent Number: 4,459,181
[45] Date of Patent: Jul. 10, 1984

[54] SEMICONDUCTOR PATTERN DEFINITION BY SELECTIVE ANODIZATION

[75] Inventor: James A. Benjamin, Waukesha

[73] Assignee: Eaton Corporation, Cleveland, Ohio

[21] Appl. No.: 421,929

[22] Filed: Sep. 23, 1982

[51] Int. Cl.³ .............................................. C25D 11/32
[52] U.S. Cl. ...................................................... 204/15
[58] Field of Search ..................................... 204/15, 26

[56] References Cited

U.S. PATENT DOCUMENTS

| | | | |
|---|---|---|---|
| 3,506,887 | 4/1970 | Gutteridge | 204/15 |
| 4,028,149 | 6/1977 | Deines | 204/15 |
| 4,104,090 | 8/1978 | Pogge | 204/15 |
| 4,242,791 | 1/1981 | Horng | 204/15 |

OTHER PUBLICATIONS

C. Hu, "A Parametric Study of Power MOSFETs", IEEE Electron Device Conference, Paper CH1461-3/79, 0000-0385.

IEEE Transactions Electron Devices, vol. ED-25, No. 10, Oct. 1978.
Ammar & Rogers, "UMOS Transistors on Silicon", Transactions IEEE, Ed-27, pp. 907-914, May 1980.
"Oxidized Porous Silicon Isolates Better Than Sapphire", Charles Cohen, Electronics, Jan. 27, 1981, pp. 77-78.

Primary Examiner—Thomas Tufariello
Attorney, Agent, or Firm—Andrus, Sceales, Starke & Sawall

[57] ABSTRACT

A pattern is defined in a semiconductor wafer by forming one or more notches from a top major surface downwardly beyond the lowermost junction between opposite conductivity type regions, and by anodizing the wafer to provide a columnated porous region below and substantially confined to the lateral dimension of each notch. Anodization current flows substantially vertically, without significant lateral spreading. The porous regions are oxidized to afford well-defined vertically bordered insulative regions separating the lowermost junctions on opposite sides thereof.

7 Claims, 2 Drawing Figures

SEMICONDUCTOR PATTERN DEFINITION BY SELECTIVE ANODIZATION

BACKGROUND AND SUMMARY

The invention relates to the known anodization technique of passing a fixed current through a semiconductor in the presence of hydrofluoric acid to create a structural change in the semiconductor material which remains single crystalline but becomes porous. The porous region may then be oxidized such that it becomes electrically insulative.

As shown in "Oxidized Porous Silicon Isolates Better Than Sapphire", Charles Cohen, Electronics, Jan. 27, 1981, pages 77–78, an entire lower substrate area of silicon beneath and around islands of single crystal silicon is anodized to a porous state, and then oxidized to dielectrically isolate the active elements to be formed in the islands. Anodization current is stopped at PN junctions and spreads laterally until it can exit between the islands.

The present invention utilizes anodization in a selective manner for pattern definition. Rather than anodizing a entire lower substrate, the present invention provides anodization only of long narrow vertical nocthes or grooves which separate regions and define patterns. The present technique is an alternative to traditional masking and etching.

The invention may provide oxidized or non-oxidized grooves. The invention may further afford a two step technique comprising anodization, followed by oxidation and removal etching, followed another anodization from the bottom of the groove, forming a deeper groove.

DESCRIPTION OF PRIOR ART

Figure 1:
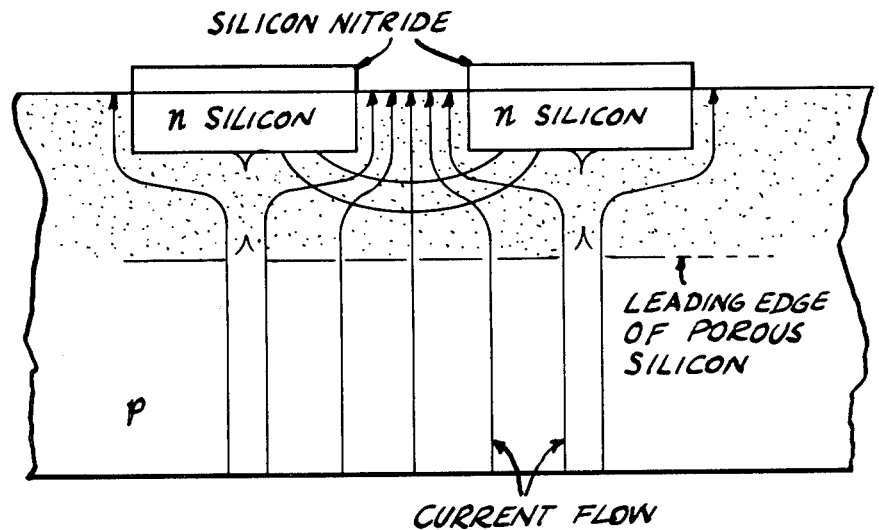
FIG. 1 is a schematic substrate diagram showing a known anodization technique.

FIG. 1 shows the substrate diagram illustrated in the above-noted Cohen article. Starting with a p type substrate having a layer of silicon nitride, island areas are masked out in which the active elements will be fabricated. Hydrogen ions are implanted through the silicon nitride island, changing the regions therebelow to n type. The device is then anodized to make the p type silicon porous between and directly below the n type islands. The wafer is placed in a hydrofluoric acid bath and electric current is passed through if from bottom to top. The current flows straight through the wafer except when it encounters the n type islands, whereupon it spreads out sideways until it can exit between the islands. Porosity works downwards from the top. The p type silicon between the islands thus becomes porous first, and the p type regions below the islands become porous later. During anodization, a structural change is created in the silicon which remains single crystalline with the remainder of the wafer but becomes porous.

The wafer is subjected to an oxidizing atmosphere such that oxygen enters the pores in the porous region and rapidly oxidizes this region. Porous silicon oxidizes much faster than nonporous silicon. The oxidized porous silicon is still single crystalline with the remainder of the wafer but substantially nonconductive.

DESCRIPTION OF THE INVENTION

Figure 2:
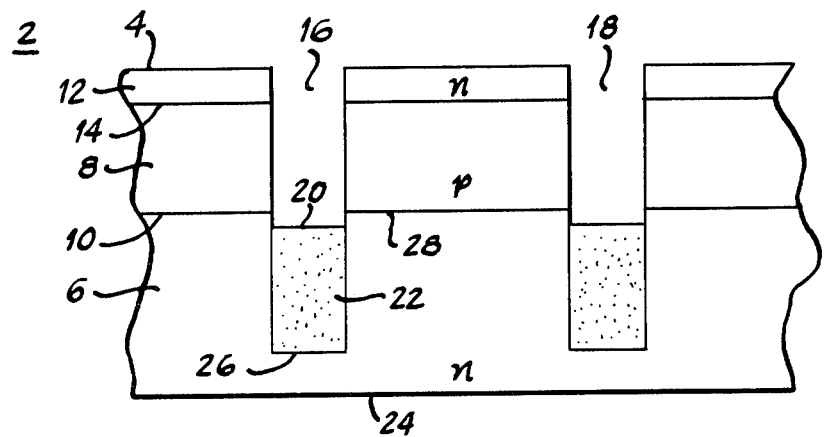
FIG. 2 is a schematic substrate diagram showing the technique of the present invention.

The present invention provides a selective anodization technique for a semiconductor 2, FIG. 2, having a top major surface 4 and at least two regions such as 6 and 8 of opposite conductivity type forming at least one junction such as 10 below top major surface 4. The number of regions and junctions is not a constraint of the invention, as shown by exemplary additional region 12 and junction 14. One or more notches such as 16 and 18 are formed from top major surface 4 downwardly to level 20 beyond the lowermost junction 10, as by plasma etching or anisotropic etching: see C. Hu, "A Parametric Study of Power MOSFETs", IEEE Electron Device Conference Paper CH-14613/79, 0000-0385; IEEE Transactions Electron Devices, Vol. ED-25, No. 10, October, 1978; and Ammar and Rogers, "UMOS Transistors on Silicon", Transactions IEEE, ED-27, pages 907–914, May, 1980.

Wafer 2 is then anodized to provide a porous region 22 below notch 16 and substantially confined to the lateral dimensions of the notch. An anode is placed across the in contact with the bottom major surface 24 of the wafer, and the wafer is immersed in hydrofluoric acid which provides the cathode contact. Anodization current flows substantially vertically between bottom major surface 24 and the bottom 20 of the notch, without significant lateral spreading. This columnated current flow is due to the cathode contact at 20 provided by the hydrofluoric acid in notch 16, and by the blocking effect of junction 10. The longer the anodization time, the deeper porous region 22 will extend. Porous region 22 may be stopped at a given lower limit such as 26, or may be allowed to proceed all the way to bottom major surface 24.

Wafer 2 may then be subjected to an oxidizing atmosphere to oxidize porous region 22, whereby to afford a well-defined vertically bordered insulative region separating lowermost junctions 10 and 28 on opposite sides thereof.

The notches or grooves may be provided with or without oxidation. An exemplary implementation of the technique is shown in copending application Ser. No. 390,471, filed June 21, 1982.

In another implementation, a two step anodization may be performed. The above described anodization is carried out, followed by oxidation and removal of the anodized oxidized material by etching. This yields a notch or groove of given depth. Another anodization is then carried out from the bottom of the groove, forming a yet deeper groove. It is recognized that various modifications are possible within the scope of the appended claims.

I claim:

1. A selective anodization technique for pattern definition in a semiconductor having a top major surface and at least two regions of opposite conductivity type forming at least one junction below said top major surface, comprising forming a notch from said top major surface downwardly beyond the lowermost junction, and anodizing said semiconductor to provide a columnated porous region below and substantially confined to the lateral dimension of said notch.

2. The invention according to claim 1 wherein anodization current flows substantially vertically between the bottom major surface of said semiconductor and the bottom of said notch, without significant lateral spreading.

3. The invention according to claim 2 comprising oxidizing said porous region, whereby to afford a well-defined vertically bordered insulative region separating the lowermost junctions on opposite sides thereof.

4. The invention according to claim 3 further comprising removing anodized oxidized material by etching to yield a groove, and then performing another anodization from the bottom of the groove, forming a deeper groove.

5. Semiconductor pattern definition by selective anodization comprising:
providing a semiconductor wafer having top and bottom major surfaces and at least two regions of opposite conductivity type forming at least one junction below said top major surface;
forming a plurality of notches in said wafer from said top major surface downwardly beyond the lowermost junction; and
anodizing said wafer such that anodization current flows substantially vertically between said bottom major surface and the bottoms of said notches, without significant lateral spreading, to provide a plurality of columnated porous regions below and substantially confined to the lateral dimensions of respective said notches.

6. The invention according to claim 5 comprising oxidizing said wafer to afford a plurality of well-defined vertically bordered insulative regions separating the respective lowermost junctions on opposite sides thereof.

7. A selective two step anodization technique for pattern definition in a semiconductor having a top major surface and at least two regions of opposite conductivity type forming at least one junction below said top major surface, comprising forming a notch from said top major surface downwardly beyond the lowermost junction, anodizing said semiconductor to provide a columnated porous region below and a substantially confined to the lateral dimensions of said notch, removing anodized material by etching to yield a groove, and performing another anodization from the bottom of said groove, forming a deeper groove.

* * * * *